US006967896B2

(12) United States Patent
Eisen et al.

(10) Patent No.: US 6,967,896 B2
(45) Date of Patent: Nov. 22, 2005

(54) ADDRESS SCRAMBLE

(75) Inventors: Shai Eisen, Tel Aviv (IL); Roni Varkony, Kfar Yona (IL); Mori Edan, Carmel (IL)

(73) Assignee: Saifun Semiconductors LTD, Netanya (IL)

( * ) Notice: Subject to any disclaimer, the term of this patent is extended or adjusted under 35 U.S.C. 154(b) by 451 days.

(21) Appl. No.: 10/354,188

(22) Filed: Jan. 30, 2003

(65) Prior Publication Data

US 2004/0153620 A1    Aug. 5, 2004

(51) Int. Cl.[7] .......................... G11C 8/00; G11C 16/04
(52) U.S. Cl. .............................. 365/238.5; 365/185.03
(58) Field of Search ..................... 365/189.01, 230.1, 365/238.5, 185.03, 185.11

(56) References Cited

U.S. PATENT DOCUMENTS

| | | |
|---|---|---|
| 3,895,360 A | 7/1975 | Cricchi et al. |
| 4,388,705 A | 6/1983 | Sheppard |
| 4,389,705 A | 6/1983 | Sheppard |
| 4,527,257 A | 7/1985 | Cricchi |
| 4,667,217 A | 5/1987 | Janning |
| 4,725,984 A | 2/1988 | Ip et al. |
| 4,761,764 A | 8/1988 | Watanabe |
| 5,027,321 A | 6/1991 | Park |
| 5,042,009 A | 8/1991 | Kazerounian et al. |
| 5,142,496 A | 8/1992 | Van Buskirk |
| 5,241,497 A | 8/1993 | Komarek |
| 5,276,646 A | 1/1994 | Kim et al. |
| 5,289,412 A | 2/1994 | Frary et al. |
| 5,293,563 A | 3/1994 | Ohta |
| 5,295,108 A | 3/1994 | Higa |
| 5,305,262 A | 4/1994 | Yoneda |
| 5,335,198 A | 8/1994 | Van Buskirk et al. |
| 5,345,425 A | 9/1994 | Shikatani |
| 5,349,221 A | 9/1994 | Shimoji |
| 5,359,554 A | 10/1994 | Odake et al. |
| 5,361,343 A | 11/1994 | Kosomocky et al. |
| 5,381,374 A | 1/1995 | Shiraishi et al. |

(Continued)

FOREIGN PATENT DOCUMENTS

EP    1 071 096    1/2001

(Continued)

OTHER PUBLICATIONS

U.S. Appl. No. 09/730,586, filed Dec. 7, 2000, Avni et al.
Bude et al., "EEPROM/Flash Sub 3.0V drain—Source Bias Hot Carrier Writing", IEDM, 1995, pp. 989-992.
Bude et al., "Modeling Nonequilibrium Hot Carrier Device Effects", Conference of Insulator Specialists of Europe, Jun., 1997.
Ricco et al., "Nonvolatile Multilevel Memories for Digital Applications", Proceedings of the IEEE, Dec., 1998, pp. 2399-2421, vol. 86, No. 12, Institute of Electrical and Electronics Engineers, Inc.

*Primary Examiner*—Trong Phan
(74) *Attorney, Agent, or Firm*—Eitan Law Group

(57) ABSTRACT

A method for operating a memory cell array, the method comprising assigning word lines of a memory cell array as addresses for writing sets of data thereto from a cache memory, and scrambling addresses of the sets of data by writing a first chunk of the particular set of data from the cache memory to a first word line of the array, and writing a second chunk of the particular set of data from the cache memory to a second word line of the array, the first chunk comprising a first subset of the particular set of data and the second chunk comprising a second subset of the particular set of data.

9 Claims, 2 Drawing Sheets

U.S. PATENT DOCUMENTS

| | | | |
|---|---|---|---|
| 5,418,743 A | 5/1995 | Tomioka et al. | |
| 5,422,844 A | 6/1995 | Wolstenholme et al. | |
| 5,424,978 A | 6/1995 | Wada et al. | |
| 5,434,825 A | 7/1995 | Harari | |
| 5,440,505 A | 8/1995 | Fazio et al. | |
| 5,450,341 A | 9/1995 | Sawada et al. | |
| 5,450,354 A | 9/1995 | Sawada et al. | |
| 5,477,499 A | 12/1995 | Van Buskirk et al. | |
| 5,508,968 A | 4/1996 | Collins et al. | |
| 5,521,870 A | 5/1996 | Ishikawa | |
| 5,523,972 A | 6/1996 | Rashid et al. | |
| 5,530,803 A | 6/1996 | Chang et al. | |
| 5,537,358 A | 7/1996 | Fong | |
| 5,544,116 A | 8/1996 | Chao et al. | |
| 5,563,823 A | 10/1996 | Yiu et al. | |
| 5,568,085 A | 10/1996 | Eitan et al. | |
| 5,583,808 A | 12/1996 | Brahmbhatt | |
| 5,623,438 A | 4/1997 | Guritz et al. | |
| 5,627,790 A | 5/1997 | Golla et al. | |
| 5,644,531 A | 7/1997 | Kuo et al. | |
| 5,657,332 A | 8/1997 | Auclair et al. | |
| 5,677,869 A | 10/1997 | Fazio et al. | |
| 5,689,459 A | 11/1997 | Chang et al. | |
| 5,694,356 A | 12/1997 | Wong et al. | |
| 5,712,815 A | 1/1998 | Bill et al. | |
| 5,717,632 A | 2/1998 | Richart et al. | |
| 5,748,534 A | 5/1998 | Dunlap et al. | |
| 5,751,637 A | 5/1998 | Chen et al. | |
| 5,754,475 A | 5/1998 | Bill et al. | |
| 5,768,193 A | 6/1998 | Lee et al. | |
| 5,771,197 A | 6/1998 | Kim | |
| 5,784,314 A | 7/1998 | Sali et al. | |
| 5,787,036 A | 7/1998 | Okazawa | |
| 5,805,500 A | 9/1998 | Campardo et al. | |
| 5,812,449 A | 9/1998 | Song | |
| 5,812,456 A | 9/1998 | Hull et al. | |
| 5,812,457 A | 9/1998 | Arase | |
| 5,828,601 A | 10/1998 | Hollmer et al. | |
| 5,841,700 A | 11/1998 | Chang | |
| 5,841,715 A * | 11/1998 | Farmwald et al. | 365/238.5 |
| 5,847,441 A | 12/1998 | Cutter et al. | |
| 5,870,334 A | 2/1999 | Hemink et al. | |
| 5,870,335 A | 2/1999 | Khan et al. | |
| 5,886,927 A | 3/1999 | Takeuchi | |
| 5,892,710 A | 4/1999 | Fazio et al. | |
| 5,926,409 A | 7/1999 | Engh et al. | |
| 5,936,888 A | 8/1999 | Sugawara | |
| 5,940,332 A | 8/1999 | Artieri | |
| 5,946,258 A | 8/1999 | Evertt et al. | |
| 5,949,714 A | 9/1999 | Hemink et al. | |
| 5,949,728 A | 9/1999 | Liu et al. | |
| 5,969,993 A | 10/1999 | Takeshima | |
| 5,982,666 A | 11/1999 | Campardo | |
| 5,986,940 A | 11/1999 | Atsumi et al. | |
| 5,991,202 A | 11/1999 | Derhacobian et al. | |
| 5,999,444 A | 12/1999 | Fujiwara et al. | |
| 6,011,725 A | 1/2000 | Eitan | |
| 6,034,896 A | 3/2000 | Ranaweera et al. | |
| 6,044,022 A | 3/2000 | Nachumovsky | |
| 6,064,591 A | 5/2000 | Takeuchi et al. | |
| 6,075,724 A | 6/2000 | Li et al. | |
| 6,084,794 A | 7/2000 | Lu et al. | |
| 6,091,640 A | 7/2000 | Kawahara et al. | |
| 6,097,639 A | 8/2000 | Choi et al. | |
| 6,108,240 A | 8/2000 | Lavi et al. | |
| 6,118,692 A | 9/2000 | Bamks | |
| 6,128,226 A | 10/2000 | Eitan et al. | |
| 6,134,156 A | 10/2000 | Eitan | |
| 6,147,904 A | 11/2000 | Liron | |
| 6,157,570 A | 12/2000 | Nachumovsky | |
| 6,169,691 B1 | 1/2001 | Pasotti et al. | |
| 6,181,605 B1 | 1/2001 | Hollmer et al. | |
| 6,185,143 B1 | 2/2001 | Perner et al. | |
| 6,192,445 B1 | 2/2001 | Rezvani | |
| 6,201,737 B1 | 3/2001 | Hollmer et al. | |
| 6,205,056 B1 | 3/2001 | Pan et al. | |
| 6,215,148 B1 | 4/2001 | Eitan | |
| 6,219,746 B1 * | 4/2001 | Vogley | 365/238.5 |
| 6,222,762 B1 | 4/2001 | Guterman et al. | |
| 6,233,180 B1 | 5/2001 | Eitan et al. | |
| 6,240,032 B1 | 5/2001 | Fukumoto | |
| 6,240,040 B1 | 5/2001 | Akaogi et al. | |
| 6,252,799 B1 | 6/2001 | Liu et al. | |
| 6,282,133 B1 | 8/2001 | Nakagawa et al. | |
| 6,285,589 B1 | 9/2001 | Kajitani | |
| 6,292,394 B1 | 9/2001 | Cohen et al. | |
| 6,304,485 B1 | 10/2001 | Harari et al. | |
| 6,307,807 B1 | 10/2001 | Sakui et al. | |
| 6,320,786 B1 | 11/2001 | Chang et al. | |
| 6,331,950 B1 | 12/2001 | Kuo et al. | |
| 6,351,415 B1 | 2/2002 | Kushnarenko | |
| 6,353,554 B1 | 3/2002 | Banks | |
| 6,396,741 B1 | 5/2002 | Bloom et al. | |
| 6,438,031 B1 | 8/2002 | Fastow | |
| 6,442,074 B1 | 8/2002 | Hamilton et al. | |
| 6,469,929 B1 | 10/2002 | Kushnarenko et al. | |
| 6,469,935 B2 | 10/2002 | Hayashi | |
| 6,477,085 B1 | 11/2002 | Kuo | |
| 6,490,204 B2 | 12/2002 | Bloom et al. | |
| 6,496,414 B2 | 12/2002 | Kasa et al. | |
| 6,510,082 B1 | 1/2003 | Le et al. | |
| 6,519,182 B1 | 2/2003 | Derhacobian et al. | |
| 6,522,585 B2 | 2/2003 | Pasternak | |
| 6,525,969 B1 | 2/2003 | Kurihara et al. | |
| 6,529,412 B1 | 3/2003 | Chen et al. | |
| 6,535,434 B2 | 3/2003 | Maayan et al. | |
| 6,552,387 B1 | 4/2003 | Eitan | |
| 6,567,303 B1 | 5/2003 | Hamilton et al. | |
| 6,567,312 B1 | 5/2003 | Torii et al. | |
| 6,574,139 B2 | 6/2003 | Kurihara | |
| 6,584,017 B2 | 6/2003 | Maayan et al. | |
| 6,590,811 B1 | 7/2003 | Hamilton et al. | |
| 6,594,181 B1 | 7/2003 | Yamada | |
| 6,618,290 B1 | 9/2003 | Wang et al. | |
| 6,636,440 B2 | 10/2003 | Maayan et al. | |
| 6,639,837 B2 | 10/2003 | Takano et al. | |
| 6,639,844 B1 | 10/2003 | Liu et al. | |
| 6,639,849 B2 | 10/2003 | Takahashi et al. | |
| 6,643,177 B1 | 11/2003 | Le et al. | |
| 6,643,178 B2 | 11/2003 | Kurihara | |
| 6,650,568 B2 | 11/2003 | Iijima | |
| 6,665,769 B2 | 12/2003 | Cohen et al. | |
| 6,690,602 B1 | 2/2004 | Le et al. | |
| 6,724,663 B2 * | 4/2004 | Roohparvar et al. | 365/185.11 |
| 6,775,759 B2 * | 8/2004 | Janzen | 365/238.5 |
| 6,836,441 B2 * | 12/2004 | Park | 365/238.5 |
| 2002/0004878 A1 | 1/2002 | Norman | |
| 2002/0034097 A1 | 3/2002 | Banks | |
| 2002/0071313 A1 | 6/2002 | Takano et al. | |
| 2002/0132436 A1 | 9/2002 | Eliyahu et al. | |
| 2002/0191465 A1 | 12/2002 | Maayan et al. | |
| 2003/0021155 A1 | 1/2003 | Yachareni et al. | |
| 2003/0072192 A1 | 4/2003 | Bloom et al. | |
| 2003/0117841 A1 | 6/2003 | Yamashita | |
| 2003/0117861 A1 | 6/2003 | Maayan | |
| 2003/0131186 A1 | 7/2003 | Buhr | |
| 2003/0142544 A1 | 7/2003 | Maayan et al. | |
| 2003/0156456 A1 | 8/2003 | Shappir et al. | |
| 2003/0208663 A1 | 11/2003 | Van Buskirk et al. | |
| 2003/0214844 A1 | 11/2003 | Iijima | |
| 2004/0008541 A1 | 1/2004 | Maayan et al. | |
| 2004/0012993 A1 | 1/2004 | Kurihara | |
| 2004/0013000 A1 | 1/2004 | Torii | |

| | FOREIGN PATENT DOCUMENTS | |
|---|---|---|
| EP | WO 01/84552 | 11/2001 |
| EP | 1 164 597 | 12/2001 |
| EP | 0 656 628 | 4/2003 |
| EP | WO 03/063167 | 7/2003 |
| EP | WO 03/088260 | 10/2003 |
| JP | 07193151 | 7/1995 |
| JP | 408106791 | 4/1996 |
| JP | 408297988 | 11/1996 |
| JP | 09162314 | 6/1997 |
| JP | 08-258215 | 4/1998 |
| JP | 10 334676 | 12/1998 |
| JP | 02002216488 | 8/2002 |
| WO | WO 00/46808 | 8/2000 |
| WO | WO 03/036651 | 5/2003 |
| WO | WO03/063168 | 7/2003 |
| WO | WO 03/088259 | 10/2003 |
| WO | WO03/088261 | 10/2003 |

* cited by examiner

ADDRESS SCRAMBLE

FIELD OF THE INVENTION

The present invention relates generally to performing read and write operations on non-volatile memory (NVM) arrays, such as electrically erasable, programmable read only memory (EEPROM) arrays, and particularly to methods for performing such read and write operations with address scrambling.

BACKGROUND OF THE INVENTION

Non-volatile memory (NVM) arrays, such as but not limited to, electrically erasable, programmable read only memory (EEPROM) arrays, are utilized for storage of data. Typically, the data stored therein may be changed, either by programming or erasing multiple times over the lifetime of the array. In NVM arrays, each cell may be individually programmed. In EEPROM arrays, each cell may be individually erased, as opposed to erasable, programmable read only memory (EPROM or FLASH arrays, wherein groups of cells, instead of individual cells, may be erased.

Reference is now made to FIG. 1, which illustrates a typical NVM array 10. The NVM array 10 may typically comprise rows and columns of memory cells 12 connected to word lines 14 (rows of the array) and bit lines 16 (columns). The memory cells 12 may store one or more bits (e.g., single bit cells or dual bit cells). The description follows for dual bit cells having a left-side bit 18 and a right-side bit 19 in the sense of FIG. 1.

Each memory cell may be connected to one word line and at least one bit line. Depending on the array architecture, another terminal of the memory cell may be connected to another bit line as shown in FIG. 1, in which case one of the bit lines is called the drain line and the other is the source line. Other connections are also possible in other array architectures, such as connecting to a common source ground. Reading, programming (also referred to as writing) or erasing bits of cells requires application of certain voltages to the word line and bit lines.

Programming a bit of a memory cell increases the threshold voltage $V_t$ thereof. Programming typically comprises application of a positive voltage to the word line and drain line connected to the bit to be programmed, with the source grounded. Reading the bit typically comprises application of a much lower positive voltage to the word line than that used for writing, and a positive voltage to the drain, with the source grounded. Erasing the cell decreases the threshold voltage $V_t$. Erasing typically comprises application of a negative voltage to the word line and a positive voltage to the drain line, with the source floating.

Program-word-line voltages are generally applied only to the word line to which the bit to be programmed is connected. All other word lines in the array are typically grounded in order to avoid various problems, such as but not limited to, unwanted programming of bits on other word lines and unwanted disturbs to other bits in the array. Accordingly, a single write operation may be used to program a byte of data by programming the data into bits that are connected to a common word line.

A user wishing to write data to a NVM array may typically write the data to a cache memory, such as but not limited to, a static random access memory (SRAM). The cache memory routes or "addresses" the data to the appropriate bits in the NVM array. As mentioned above, a single write operation may program a byte of data to bits connected to a common word line. Therefore, in an efficient write operation, a byte address would comprise both the left-side bits 18 and the right-side bits 19 of the cells on a common word line, as indicated by reference numeral 20 in FIG. 1.

Unlike a write (i.e., program) operation, in a read operation it may be possible to use more than one word line at a time. This may be possible due to the lower word line voltages used in a read operation, which may be sufficiently low so as not to cause unwanted disturbs or programming of other bits in the array. There is an incentive to use more than one word line at a time, because it would speed up the read operation. In order to read bits on multiple word lines at the same, the bits should be connected to common bit lines. Accordingly, the left-side bits 18 of a given cell would belong to a different byte address than the right-side bits 19 of the same cell, as indicated by reference numeral 22 in FIG. 1.

In light of the foregoing explanation, in an effort to speed up the reading operation, a conflict may exist in the byte addresses of an NVM array. In the write operation, the byte address may comprise both the left-side bits 18 and the right-side bits 19 of the cells on a common word line. However, in the read operation, the byte address may comprise only the left-side bits 18 over multiple word lines (or the right-side bits 19 over multiple word lines). This poses a problem in addressing the bytes for both write and read operations.

SUMMARY OF THE INVENTION

The present invention seeks to provide solutions to the abovementioned conflict between write and read operations in an NVM array. The invention may be carried out with any kind of NVM cell and array, such as but not limited to, nitride read-only memory (NROM) cells and arrays. The invention may be implemented in a variety of applications, such as but not limited to, mass storage or code flash applications, for example.

In accordance with a preferred embodiment of the present invention, data may be stored, such as in terms of bytes of data, in a cache memory, such as but not limited to, a static random access memory (SRAM). The bytes of data may be divided into chunks of data. Each byte may have a particular word line address for writing to the array. Writing from the cache memory to the array may comprise scrambling the word line addresses of the chunks of data such that one chunk is written to a first word line address and another chunk is written to a different word line address. In this manner, it may be possible to store the bits associated with an entire byte along a common bit line. Reading from the array may then comprise reading the bits of the byte along common bit lines, thereby descrambling the chunks back to their original bytes.

There is thus provided in accordance with an embodiment of the invention a method for operating a memory cell array, the method comprising assigning word lines of a memory cell array as addresses for writing sets of data thereto from a cache memory, and scrambling addresses of the sets of data by writing a first chunk of the particular set of data from the cache memory to a first word line of the array, and writing a second chunk of the particular set of data from the cache memory to a second word line of the array, the first chunk comprising a first subset of the particular set of data and the second chunk comprising a second subset of the particular set of data.

In accordance with an embodiment of the invention the method further comprises reading the particular set of data from the array by serially reading the first chunk from the first word line and reading the second chunk from the second word line. The data may comprise at least one byte that comprises at least two chunks of at least four bits.

Further in accordance with an embodiment of the invention the method comprises assigning the addresses to bits A1, . . . An in the cache memory, wherein An is the most significant bit (MSB), and assigning A0, the least significant bit (LSB), to a bit of information, called "chunk select", adapted to determine which chunk of the bits is to be read or written. The sets of data may be written to the cache memory while not writing to the chunk select. The first and second word lines may comprise adjacent or non-adjacent word lines.

Still further in accordance with an embodiment of the invention the method comprises reading the particular set of data from the array by switching the chunk select from the LSB to bit A1 and assigning the LSB to the first word line, reading the first chunk from the first word line, switching the chunk select from bit A1 to the LSB and assigning bit A1 to the second word line, and reading the second chunk from the second word line.

In accordance with an embodiment of the invention the method further comprises internally writing from the memory cell array back to the cache memory by descrambling the scrambling of the addresses of the sets of data.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

Figure 1:
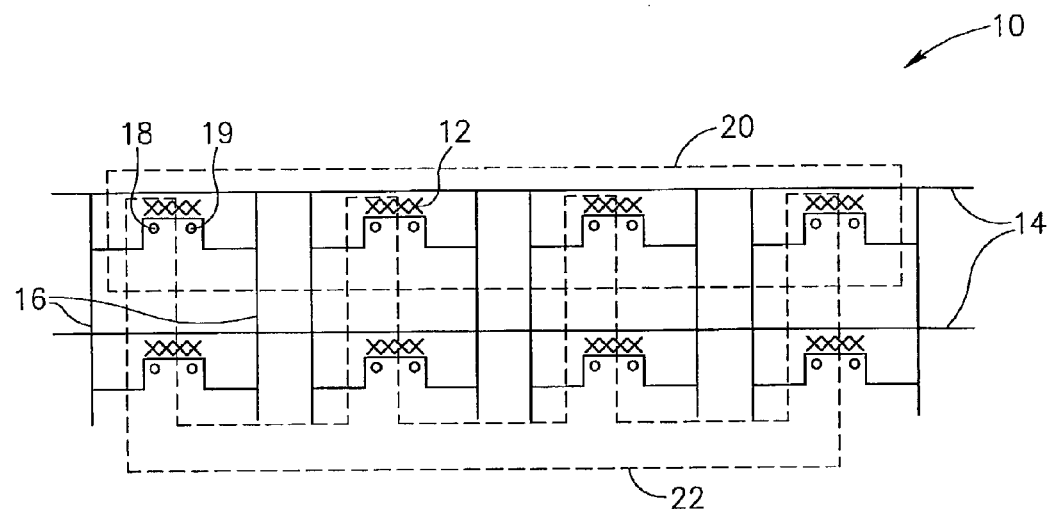
FIG. 1 is a simplified illustration of a non-volatile memory (NVM) array.
Figure 2:
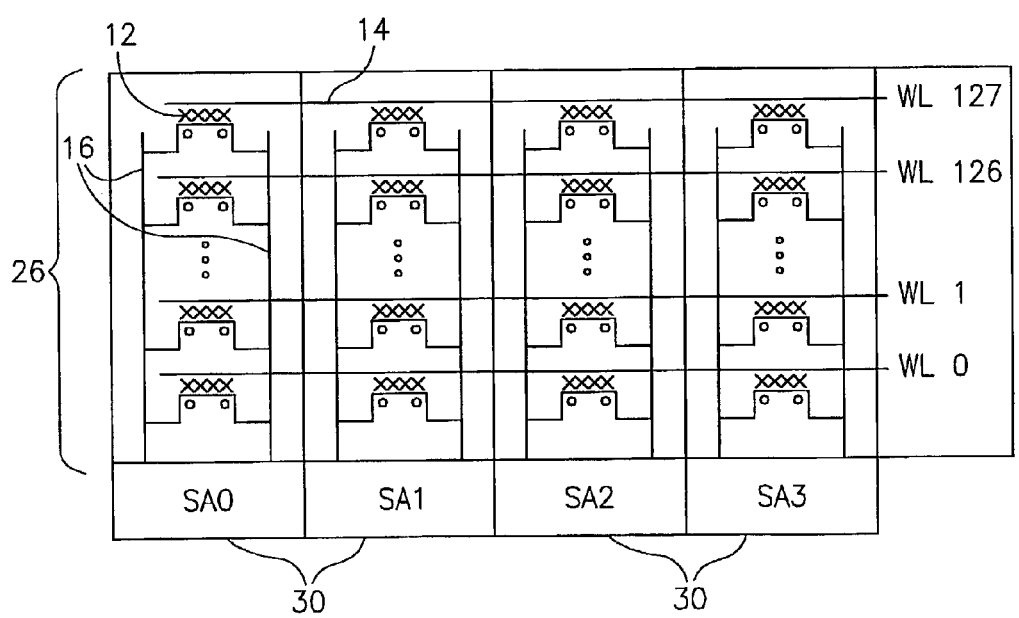
FIG. 2 is a simplified illustration of an array architecture for a NVM array, in accordance with an embodiment of the present invention.

Reference is now made to FIG. 2, which illustrates an array architecture for a NVM array, in accordance with an embodiment of the present invention. As in FIG. 1, the NVM array may comprise dual bit memory cells 12 connected to word lines 14 and bit lines 16. Each dual bit cell 12 may comprise a left-side bit and a right-side bit. It is emphasized that the invention is not limited to this architecture.

One sector 26 of the array may be defined by four columns of dual bit cells, a total of 8 bits or 1 byte for each word line 14 of the sector 26 (although the invention is not limited to these values). The sector 26 may comprise any number of word lines 14. In the illustrated embodiment, the sector 26 comprises 128 word lines (WL 0, WL 1, WL 2, . . . WL 127), which amounts to one page (=128 bytes). However, it is emphasized that the invention is not limited to these values.

In accordance with an embodiment of the present invention, one or more sense amplifiers 30 may be used to read bits of the array. For example, in the illustrated embodiment, there are shown four sense amplifiers SA0, SA1, SA2 and SA3, wherein each sense amplifier 30 may be used to read two bits of a byte. Accordingly, since each byte of data comprises 8 bits, reading a byte may require two read operations performed serially on groups of 4 bits, these groups being herein referred to as chunks. It is appreciated, however, that the invention is not limited to bytes nor to chunks of 4 bits, and other amounts of bits may be used to carry out the invention.

Figure 3:
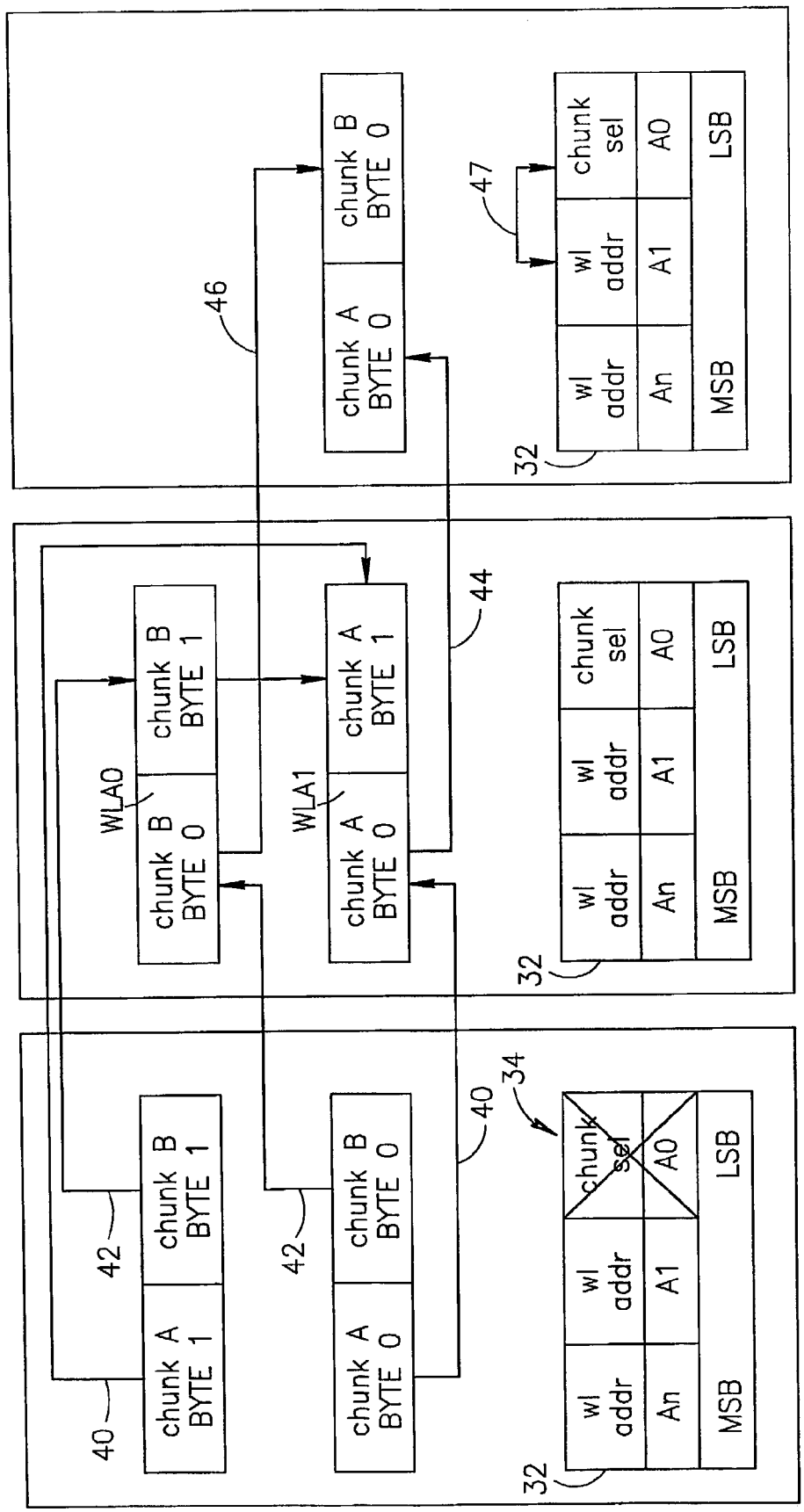
FIG. 3 is a simplified illustration of write and read operations using address scrambling in the architecture of FIG. 2, in accordance with an embodiment of the present invention.

Reference is now made to FIG. 3, which illustrates write and read operations using address scrambling in the architecture of FIG. 2, in accordance with an embodiment of the present invention. A user may write data to a cache memory 32, such as but not limited to, a static random access memory (SRAM), herein referred to as SRAM 32. SRAM 32 addresses the data to the appropriate bits in the NVM array. The data is preferably written to the SRAM 32 in a byte granularity.

SRAM 32 may comprise bits A0, A1, . . . An, wherein A0 is the least significant bit (LSB) and An is the most significant bit (MSB). The word line addresses ("w1 addr") may comprise n bits A1, . . . An, whereas the LSB (A0) may be dedicated to storing a bit of information referred to as "chunk select address bit" or simply "chunk select", which may be used to determine which chunk of bits is to be read or written at each step of the process, as is explained further hereinbelow. During writing of data to SRAM 32, as indicated by reference arrow 34, the chunk select address bit (LSB) may be ignored.

As mentioned before, each byte may comprise two chunks of 4 bits. For example, byte 0 may comprise "chunk A byte 0" and "chunk B byte 0" and byte 1 may comprise "chunk A byte 1" and "chunk B byte 1".

Data may then be written from SRAM 32 to the array by scrambling the addresses of the chunks of bits of two different bytes, such as two neighboring bytes. For example, as indicated by arrows 40, chunk A byte 0 and chunk A byte 1 may be written to first word line WL A0. As indicated by arrows 42, chunk B byte 0 and chunk B byte 1 may be written to second word line WL A1 in the array. In this example, the chunks have been written to adjacent word lines, but the invention is not limited to writing to adjacent word lines, and the chunks may be written to non-adjacent word lines. It is noted that while the bytes are read from SRAM 32, only the word line addresses may be active.

The chunk select address may control the address scrambling. For example, the chunk select address may be activated to generate "write data" bytes, wherein:

Write data byte 0={chunk A byte 0, chunk A byte 1}

Write data byte 1={chunk B byte 0, chunk B byte 1}

The rest of the bytes may be accordingly written from SRAM 32 to the array.

Internally writing from the array to SRAM 32 may be performed by descrambling the abovementioned address scrambling.

Read operations may be performed in a chunk level granularity (e.g., 4 bits per chunk). For two read operations that follow one after the other, the LSB address may toggle between the chunk select and the least significant bit of the write address, as is now explained.

During the first user read cycle, chunk A of byte 0 may be read by switching the "chunk select" and "WL A0" addresses, as indicated by arrow 47, such that "WL A0" is the LSB address and the "chunk select" is the A1 address, as indicated by arrow 44. After reading the first 4 bits (i.e., chunk A) of byte 0, the next 4 bits (i.e., chunk B) of byte 0 may be read by incrementing the word line to the WL A1 address and switching the chunk select to the LSB address, as indicated by arrow 46. The alternate switching between the chunk select and the incremental word line addresses may continue until all the bytes are read from the array.

It is noted that accessing the word line address in a chip is generally significantly slower than accessing bit line addresses. Accordingly, inserting the word line address before the bit select address may provide additional clock time for switching between word lines, thereby improving the speed of the read access.

It will be appreciated by persons skilled in the art that the present invention is not limited by what has been particularly shown and described herein above. Rather the scope of the invention is defined by the claims that follow:

What is claimed is:

1. A method for operating a memory cell array, the method comprising:
   assigning word lines of a memory cell array as addresses for writing sets of data thereto from a cache memory; and
   scrambling addresses of said sets of data by writing a first chunk of said particular set of data from said cache memory to a first word line of said array, and writing a second chunk of said particular set of data from said cache memory to a second word line of said array, said first chunk comprising a first subset of said particular set of data and said second chunk comprising a second subset of said particular set of data.

2. The method according to claim 1, further comprising reading said particular set of data from said array by serially reading said first chunk from said first word line and reading said second chunk from said second word line.

3. The method according to claim 1, wherein said data comprises at least one byte that comprises at least two chunks of at least four bits.

4. The method according to claim 1, wherein assigning comprises assigning said addresses to bits $A1, \ldots An$ in said cache memory, wherein $An$ is the most significant bit (MSB), and assigning $A0$, the least significant bit (LSB), to a bit of information, called "chunk select", adapted to determine which chunk of said bits is to be read or written.

5. The method according to claim 4, further comprising writing said sets of data to said cache memory while not writing to said chunk select.

6. The method according to claim 1, wherein said first and second word lines comprise adjacent word lines.

7. The method according to claim 1, wherein said first and second word lines comprise non-adjacent word lines.

8. The method according to claim 5, further comprising reading said particular set of data from said array by switching said chunk select from the LSB to bit $A1$ and assigning the LSB to said first word line, reading said first chunk from said first word line, switching said chunk select from bit $A1$ to the LSB and assigning bit $A1$ to said second word line, and reading said second chunk from said second word line.

9. The method according to claim 1, further comprising internally writing from said memory cell array back to said cache memory by descrambling said scrambling of the addresses of said sets of data.

* * * * *